(12) United States Patent
Bhattacharya

(10) Patent No.: US 8,823,395 B2
(45) Date of Patent: Sep. 2, 2014

(54) ELECTRONIC TEXTILE AND METHOD FOR DETERMINING A FUNCTIONAL AREA OF AN ELECTRONIC TEXTILE

(75) Inventor: Rabin Bhattacharya, Silver Spring, MD (US)

(73) Assignee: Koninklijke Philips N.V., Eindhoven (NL)

( * ) Notice: Subject to any disclaimer, the term of this patent is extended or adjusted under 35 U.S.C. 154(b) by 716 days.

(21) Appl. No.: 13/119,451

(22) PCT Filed: Sep. 10, 2009

(86) PCT No.: PCT/IB2009/053957
§ 371 (c)(1), (2), (4) Date: Mar. 17, 2011

(87) PCT Pub. No.: WO2010/032173
PCT Pub. Date: Mar. 25, 2010

(65) Prior Publication Data
US 2011/0175630 A1   Jul. 21, 2011

(30) Foreign Application Priority Data
Sep. 19, 2008   (EP) ..................................... 08164717

(51) Int. Cl.
*G01R 27/26* (2006.01)

(52) U.S. Cl.
USPC ....... 324/658; 198/810.02; 340/667; 442/301

(58) Field of Classification Search
USPC ...................................... 324/658; 198/810.02
See application file for complete search history.

(56) References Cited

U.S. PATENT DOCUMENTS 4,233,522 A * 11/1980 Grummer et al. ................ 341/33
4,447,807 A * 5/1984 Klein et al. .............. 198/810.02

(Continued)

FOREIGN PATENT DOCUMENTS

GB   2 443 208 A  *  4/2008  ................ G01L 1/14
GB   2443208  A     4/2008

(Continued)

OTHER PUBLICATIONS

Post et al., "E-broidery: Design and fabrication of textile-based computing", IBM Systems Journal, 2000, pp. 840-860, vol. 39, Nos. 3 & 4.

(Continued)

*Primary Examiner* — Benjamin M Baldridge

(57) ABSTRACT

The invention relates to a method for determining a functional area of an electronic textile (100;200). The electronic textile comprises a textile substrate having a first plurality of conductors (108a-b;202a-d), a second plurality of conductors (104a-c;204a-d), and a plurality of capacitors (112;212a-p), each capacitor comprising a conductor from the first plurality of conductors (108a-b;202a-d) and a conductor from the second plurality of conductors (104a-c;204a-d), separated by a dielectric (103a), the capacitors (112;212a-p) being distributed across substantially an entire surface of the electronic textile, wherein each capacitor (112;212a-p) has a capacitance of at least 10 pF.
The method comprises, for each of the capacitors, the steps of (a) applying (301) a voltage between the conductor from the first plurality of conductors associated with the capacitor and the conductor from the second plurality of conductors associated with the capacitor, (b) detecting (302) an electrical characteristic indicative of a capacitance of the capacitor, (c) evaluating (303) the detected electrical characteristic, and (d) determining (304) whether the capacitor is included in the functional area of the electronic textile based on the evaluation.
As the method takes advantages of physical characteristics inherent in the electronic textile, such as the capacitors formed between conductors in the electronic textile, no electronic devices need to be arranged on the electronic textile to determine the functional area.

20 Claims, 8 Drawing Sheets

(56) References Cited

U.S. PATENT DOCUMENTS

| | | | |
|---|---|---|---|
| 4,470,120 A * | 9/1984 | Haylett | 198/810.02 |
| 5,539,292 A * | 7/1996 | Vranish | 318/568.21 |
| 6,352,149 B1 * | 3/2002 | Gartland | 198/810.02 |
| 6,381,482 B1 | 4/2002 | Jayaraman et al. | |
| 6,784,458 B1 | 8/2004 | Wang et al. | |
| 7,106,206 B2 * | 9/2006 | Sprecher et al. | 340/667 |
| 2003/0224155 A1 | 12/2003 | Orth et al. | |
| 2005/0231379 A1 * | 10/2005 | Sprecher et al. | 340/667 |
| 2006/0035554 A1 * | 2/2006 | Glaser et al. | 442/301 |
| 2008/0257692 A1 * | 10/2008 | Wallace | 198/810.02 |
| 2009/0033078 A1 * | 2/2009 | Hawes et al. | 280/735 |
| 2009/0128511 A1 * | 5/2009 | Sinclair et al. | 345/174 |
| 2010/0083733 A1 * | 4/2010 | Russell et al. | 73/12.01 |

FOREIGN PATENT DOCUMENTS

| | | |
|---|---|---|
| WO | 0067539 A1 | 11/2000 |
| WO | 03060863 A1 | 7/2003 |
| WO | 03094719 A1 | 11/2003 |
| WO | 2004100111 A2 | 11/2004 |
| WO | 2008044202 A2 | 4/2008 |

OTHER PUBLICATIONS

Lind et al., "A Sensate Liner for Personnel Monitoring Applications", 1997, pp. 98-105.

Edmison et al., "Using Piezoelectric Materials for Wearable Electronic Textiles", 2002, pp. 1-8, Blacksburg, Virgina.

Hasegawa et al., "Fabrication of a wearable fabric tactile sensor produced by artificial hollow fiber", 2008, pp. 1-8, Nagoya, Japan.

* cited by examiner

ELECTRONIC TEXTILE AND METHOD FOR DETERMINING A FUNCTIONAL AREA OF AN ELECTRONIC TEXTILE

FIELD OF THE INVENTION

The present invention relates to an electronic textile and a method for determining a functional area of an electronic textile. The invention further relates to a controller for determining a functional area of an electronic textile.

BACKGROUND OF THE INVENTION

Textiles are used in our everyday life. When textiles and electronics are integrated, new application fields emerge. In many fields, such as the clothing industry, textiles are cut out from large sheets to form desired shapes and features. Conversely, electronic components are typically placed onto a predefined circuit board that is already sized for the functionality. If electronics are placed onto textiles, manufacturing costs will decrease and user versatility will increase if the electronic textile sheets can be cut to any shape without losing functionality.

US 2006/0035554 discloses a textile fabric that can be produced with a large size and be cut to a desired shape. The fabric has a plurality of microelectronic components for electronic data processing arranged throughout the textile fabric. These microelectronic components exchange electronic messages with each other to enable self-organization to thereby adapt the electronic textile to a particular size obtained.

A drawback of the electronic textile disclosed in US 2006/0035554 is that a large number of microelectronic devices capable of processing and data-communication are needed, which leads to increased costs for the electronic textile.

SUMMARY OF THE INVENTION

In view of the above-mentioned and other drawbacks of the prior art, a general object of the present invention is to provide a cost-efficient and versatile way of determining a functional area of an electronic textile.

According to a first aspect of the invention, these and other objects are achieved through a method for determining a functional area of an electronic textile comprising a textile substrate having a first plurality of conductors and a second plurality of conductors, wherein the textile substrate is configured such that a plurality of capacitors, each comprising a conductor from the first plurality of conductors and a conductor from the second plurality of conductors separated by a dielectric, are formed across substantially an entire surface of the electronic textile, the method comprising, for each of the capacitors, the steps of: applying a voltage between the conductor from the first plurality of conductors associated with the capacitor and the conductor from the second plurality of conductors associated with the capacitor; detecting an electrical characteristic indicative of a capacitance of the capacitor; evaluating the detected electrical characteristic; and determining whether the capacitor is included in the functional area of the electronic textile based on the evaluation.

As the method takes advantages of physical characteristics inherent in the electronic textile, such as the capacitors formed between conductors in the electronic textile, no electronic devices (such as e.g. the microelectronic components described in prior art) need to be arranged on the electronic textile to determine the functional area. This reduces the cost and also provides enhanced versatility as the functional area can be determined before, or after, any electronic devices has been arranged on the electronic textile. Furthermore, all the required functionality can be accommodated in a single controller adapted to control the voltage applied to the conductors. The controller may be arrangeable on the electronic textile, or be provided in an external device (e.g. in a portable or stationary testing device). The method can be used during manufacturing, and/or as the electronic textile is in operation. The method may be utilized to determine the functional area of an electronic textile, for example, after it has been cut to a desired shape, but also to detect connection faults in the electronic textile (such as a broken conductor). This allows the controller to adapt any driving data to the functional area, e.g. if the electronic textile is used as a textile display the controller can adjust the image to the size and shape of the still addressable pixels.

By functional area should here be understood the area of the electronic textile that is addressable. In an application where the electronic textile has been cut to a desired shape, the functional area may refer to the part of the textile which has not been cut away. However, parts of the electronic textile where the conductors are broken may also be excluded from the functional area.

The present invention is based on the understanding that by proper configuration of a textile substrate having a plurality conductors, the conductors may form a plurality of capacitors having a measurable capacitance. The inventor has further realized that the functional area can be determined by providing such capacitors substantially across the entire surface of the electronic textile and evaluating the capacitance of the capacitors.

It is understood by a person skilled in the art that the exact distribution will vary, for example, due to the application. For instance, if the electronic textile is used for a textile display device it may be preferable to configure the electronic textile such that a measurable capacitor is formed for each addressable pixel.

By electronic textile should here be understood a textile substrate provided with electric conductors. The textile substrate may be based on a rigid or flexible substrate. In a particularly advantageous embodiment, the substrate is a fabric. The conductors may be interwoven conductive warp and/or weft yarn, or may be attached to the textile substrate, e.g. by stitching, embroidery, clamping, ultrasonic bonding, lamination, quilting, crocheting. Examples of other alternatives would be to use conductive ink, electro plating, electro-less plating or an etched conductor pattern.

The applied voltage may be an alternating voltage, whereas the detected electrical characteristic indicative of a capacitance may be an alternating current. The capacitor may also form a filter, wherein the output of a filtered AC (alternating current)-signal may be detected as an electrical characteristic indicative of the capacitance. Furthermore, a voltage response to the AC-signal may be detected as a electrical characteristic indicative of the capacitance. According to an alternative embodiment, a DC-voltage may be applied to charge the capacitor. The discharge current may then be detected as an electrical characteristic indicative of the capacitance. However, this generally takes longer time than the methods using an alternating voltage.

The step of evaluating the detected electrical characteristic may include comparing the detected electrical characteristic to a predetermined threshold value. However, the evaluation may also be normalized by making a comparison with values of the electrical characteristic detected for a plurality of other capacitors.

Any conductor(s) not associated with the evaluated capacitor(s) may be kept at a constant voltage (e.g. by holding them to ground i.e. 0V) while the voltage is applied between the conductors associated with the evaluated capacitor. An advantage is that the capacitance associated with the evaluated capacitor can be detected without being influenced by other parallel and series capacitances originating from other conductors.

According to a second aspect of the invention, there is provided an electronic textile comprising a textile substrate having a first plurality of conductors, a second plurality of conductors, and a plurality of capacitors, each capacitor comprising a conductor from the first plurality of conductors and a conductor from the second plurality of conductors, separated by a dielectric, the capacitors being distributed across substantially an entire surface of the electronic textile, wherein each capacitor has a capacitance of at least 10 pF.

Such an electronic textile can be manufactured by conventional manufacturing techniques, such as e.g. weaving. Furthermore, the functional area of the electronic textile can be determined without requiring any electronic devices to be arranged thereon. Furthermore, effects and features of the present second aspect of the present invention are largely analogous to those described above in connection with the first aspect.

A distance between the conductor from the first plurality of conductors associated with the capacitor and the conductor from the second plurality of conductors associated with the capacitor may be such that the capacitor has a capacitance of at least 10 pF. For example, when the textile substrate is formed from interwoven conductive and non-conductive yarn, and a capacitor is formed at a crossover between two conductive yarns, the capacitance can be adapted by changing the number of warp-layers that separates the two conductive yarns. Similarly, when a capacitor is formed between two conductive yarns arranged side-by-side, the capacitance can be adapted by changing the number of non-conductive yarns that are arranged between the two conductive yarns. A capacitance about 10 pF is typically the lowest capacitance for which measurement equipment (such as the controller) can be provided at a reasonable cost.

The dielectric between the conductor from the first plurality of conductors associated with the capacitor and the conductor from the second plurality of conductors associated with the capacitor may have a permittivity such that the capacitor has a capacitance of at least 10 pF.

A conductive area of the conductor from the first plurality of conductors associated with the capacitor and a conductive area of the conductor from the second plurality of conductors associated with the capacitor may be such that the capacitor has a capacitance of at least 10 pF.

In the case of a woven textile substrate, the conductive area can, for example, be increased by using conductive yarns with a larger diameter, or by weaving two or more conductive yarn next to each other to form a single conductor. The conductive area can also changed by adapting the length of a portion of the conductive yarns that make up the capacitor.

The textile substrate may be configured such that each capacitor has a capacitance of at least 100 pF. This can be achieved by configuring the distance between the conductors, the conductive area, and/or the dielectric. If non-conducting yarns with a high permittivity is used as a dielectric between a pair of conductors making up a capacitor, these high-permittivity-yarns may be selectively woven into the textile substrate (e.g. only between conductors that should make up a capacitor) to avoid stray capacitances. Using capacitors having a capacitance of at least 100 pF enables a more robust method which is less sensitive e.g. to noise. Furthermore, a higher capacitance is easier to detect, thereby the cost for measurement equipment (e.g. the controller) can be reduced.

The electronic textile may further comprise first and second sets of driving conductors arranged to drive a set of electronic components. The driving conductors are typically configured such that an electronic device (e.g. an LED) can easily be arranged between a conductor from the first set of driving conductors and a conductor from the second set of driving conductors. For example, the driving conductors may be accessible at the textile surface, and be arranged at a distance that allows an electronic component to be connected. An advantage is that the first and second plurality of conductors can be used to determine the functional area of the electronic textile without affecting any electronic devices connected to the driving conductors. This may be advantageous, for example, in the case of sensitive electronic components where the voltage applied to evaluate the capacitance in order to determine the functional area of the electronic textile may otherwise have a damaging effect.

The first and second plurality of conductors may be separated from the first and second set of driving conductors by an electrically insulating layer. For a textile substrate formed from interwoven conductive and non-conducive yarns, this electrically insulating layer may be at least one warp layer comprising only non-conductive yarn (whereas no conductive weft yarns crosses this at least one warp layer).

According to a third aspect of the invention there is provided a controller connectable to an electronic textile for determining a functional area thereof. The controller may be configured to evaluate each of the capacitors by applying a voltage between the conductor from the first plurality of conductors associated with the capacitor and the conductor from the second plurality of conductors associated with the capacitor; detecting an electrical characteristic indicative of a capacitance of the capacitor; evaluating the detected electrical characteristic; and determining whether the capacitor is included in the functional area of the electronic textile based on the evaluation.

The controller may be configured such that any conductors not associated with the evaluated capacitor(s) is kept at a constant voltage while the voltage is applied between the conducts associated with the evaluated capacitor.

The controller may be arranged on the electronic textile or in a testing device usable to determine a functional area of an electronic textile. The testing device may be stationary or portable. By using a testing device it is not necessary to provide a new controller for each electronic textile, further reducing costs.

BRIEF DESCRIPTION OF THE DRAWINGS

These and other aspects of the present invention will now be described in more detail, with reference to the appended drawings showing a currently preferred embodiment of the invention, wherein.

It should be noted that these figures are diagrammatic and not drawn to scale. For the sake of clarity and convenience, relative dimensions and proportions of parts of these figures have been shown exaggerated or reduced in size.

DETAILED DESCRIPTION OF THE EMBODIMENTS

In the following description, the present invention is described with reference to a textile having a very limited number of warp and weft yarns and certain, simplified, weave layouts. This should by no means limit the scope of the present invention, which is equally applicable to textiles having other kinds of weave layouts. Furthermore, although the invention is described with an intermediate non-conductive yarn which separates adjacent conductors there are other ways to provide a dielectric between adjacent conductors. For instance, the conductors may be provided with an electrically insulating coating. Moreover, as an alternative to interwoven conductive yarns, conductors could be attached to the textile substrate e.g. by stitching, embroidery, clamping, ultrasonic bonding, lamination, quilting, or crocheting. It may also be possible to use conductive ink, an etched conductor pattern, electro plating or electro-less plating.

In the description below, it is repeatedly referred to warp and weft yarns. In weaving, yarns with a general extension in the direction of weaving are commonly referred to as warp yarns, while yarns that extend substantially perpendicularly to the weaving direction (and to the warp yarns) are referred to as weft yarns. Although warp and weft yarns are typically perpendicular to each other, this is not necessarily the case, and the present invention should not be seen as limited to having warp and weft yarns that are perpendicular to each other.

Figure 1A:
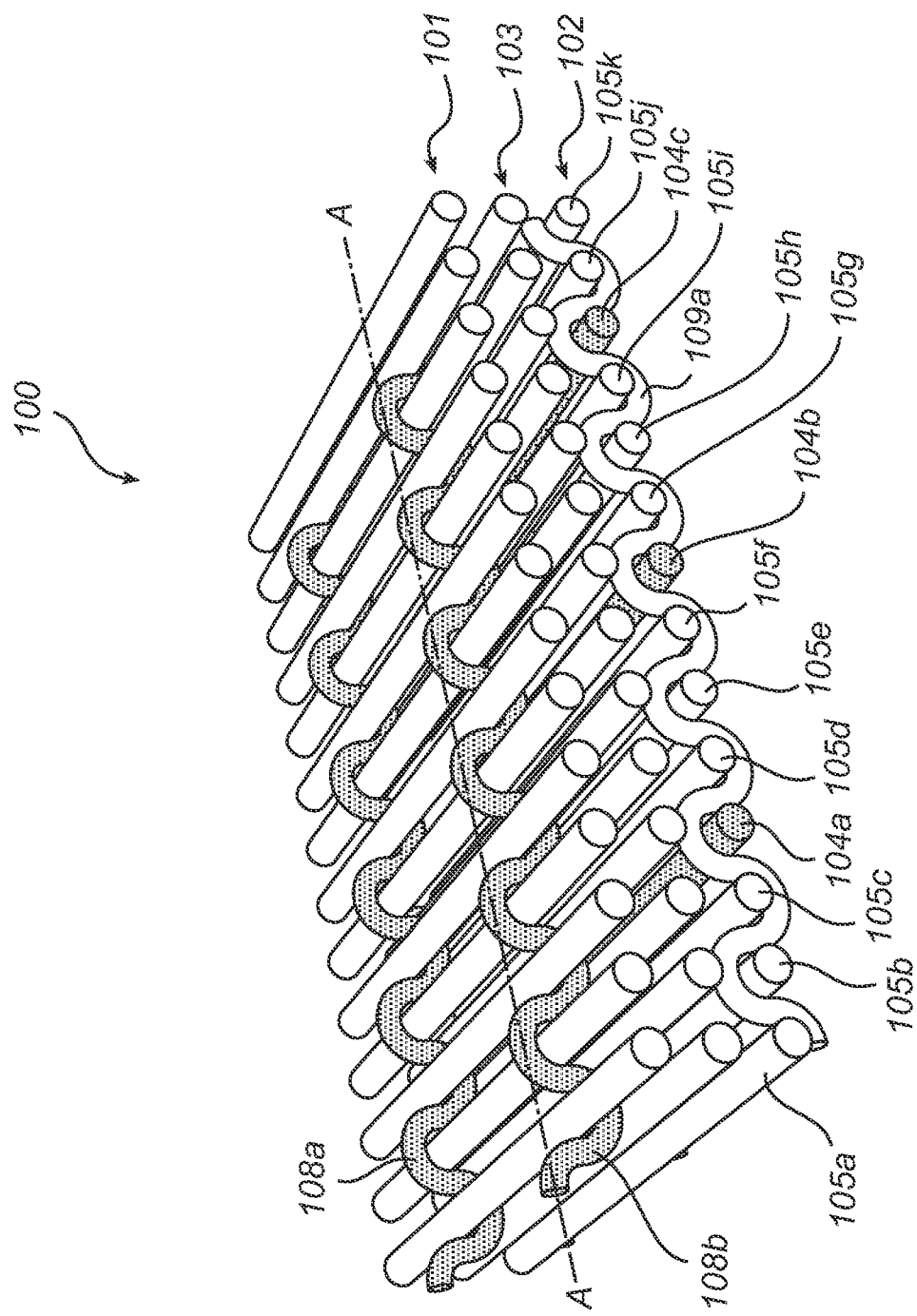
FIG. 1a schematically illustrates a three layer woven electronic textile according to an embodiment of the invention.

FIG. 1 schematically illustrates an embodiment of an electronic textile 100 according to the present invention. In FIG. 1a, a three-layer woven textile substrate according to a first embodiment of the present invention is schematically shown having an upper 101 and a lower 102 warp layer which are separated by an intermediate warp layer 103. The lower warp layer 102 comprises three conductive warp yarns 104a-c separated by non-conductive warp yarns 105a-k, whereas the upper warp layer 101 and the intermediate warp layer 103 here consists of all non-conductive warp yarns. In the weft direction, two conductive weft yarns 108a-b can be seen in FIG. 1. Non-conductive weft yarns may be present between the conductive weft yarns 108a-b shown in FIG. 1a, but have here been omitted for the sake of clarity.

Figure 1B:
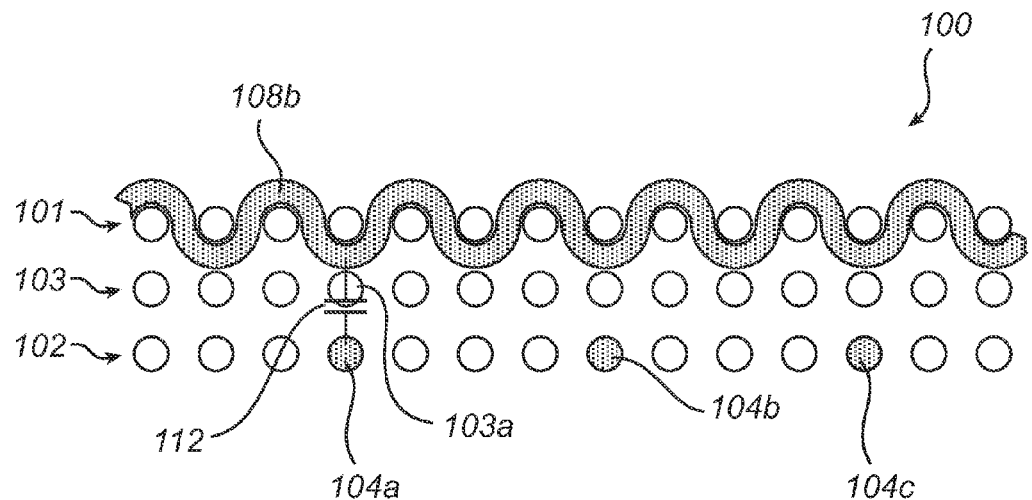
FIG. 1b is a schematic cross-section of the textile in FIG. 1.

Referring to FIG. 1b, showing a schematic cross-section of the textile substrate in FIG. 1a along the line A-A, the conductive weft yarn 108b crosses the conductive warp yarn 104a, while remaining electrically insulated there from. As the non-conductive yarn 103a in the intermediate layer 103 forms a dielectric between the conductive weft yarn 108b and the conductive warp yarn 104a a small capacitor 112 is formed at the crossover between the conductors 104a, 108b. As is recognized by a person skilled in the art the capacitance of the capacitor depends on the permittivity of the dielectric, the area of the conducting plates (i.e. the portions of the conductors that make up the capacitor) and the distance between the conducting plates. Thus, the capacitance of the capacitor can be configured to be at least 10 pF (picofarad), and more preferable at least 100 pF, for example, by adapting the number of non-conductive yarns separating the conductors. It has been found that a capacitance above 100 pF can be achieved for a pair of crossing conductors separated by one non-conductive yarn of polyamide having a weight of 110 grams per 10000 meter (corresponding to 110 dtex).

The number of yarns separating the conductors are typically one or two yarns, but depending on the application more yarns can be used. Although additional yarns reduce the capacitance, it may sometimes be desirable to have more than one non-conductive yarn separating the conductors, e.g. as this may reduce the risk of short-circuiting.

As an alternating voltage is applied between the conductive weft yarn 108b and the conductive warp yarn 104a, this results in an alternating current. The higher the frequency of the alternating voltage is, the more current flows between the conductive weft yarn 108b and the conductive warp yarn 104a.

The frequency can preferably be in the range of 1 kHz to 1 MHz, to avoid disturbances, for example, from fluorescent light (for lower frequencies) or radio signals (for higher frequencies). A higher frequency also tends to consume more power. Thus, a typical frequency may more preferably be in the range of 1 kHz to 500 kHz.

The voltage applied to measure the capacitance may preferably be in the normal operating voltage of the electronic textile, i.e. typically in the range of 0.5 V to 20 V.

It is understood that the principle of a capacitor described above with reference to the crossover between conductive weft yarn 108b and the conductive warp yarn 104a, also applies to other conductors separated by a dielectric when properly configured (i.e. appropriate permittivity of the dielectric, and area and distance of the conducting plates). Furthermore, the conductors do not need to cross each other to form a capacitor, but may also run side by side (e.g. two parallel warp conductive yarns separated by a dielectric).

Figure 2:
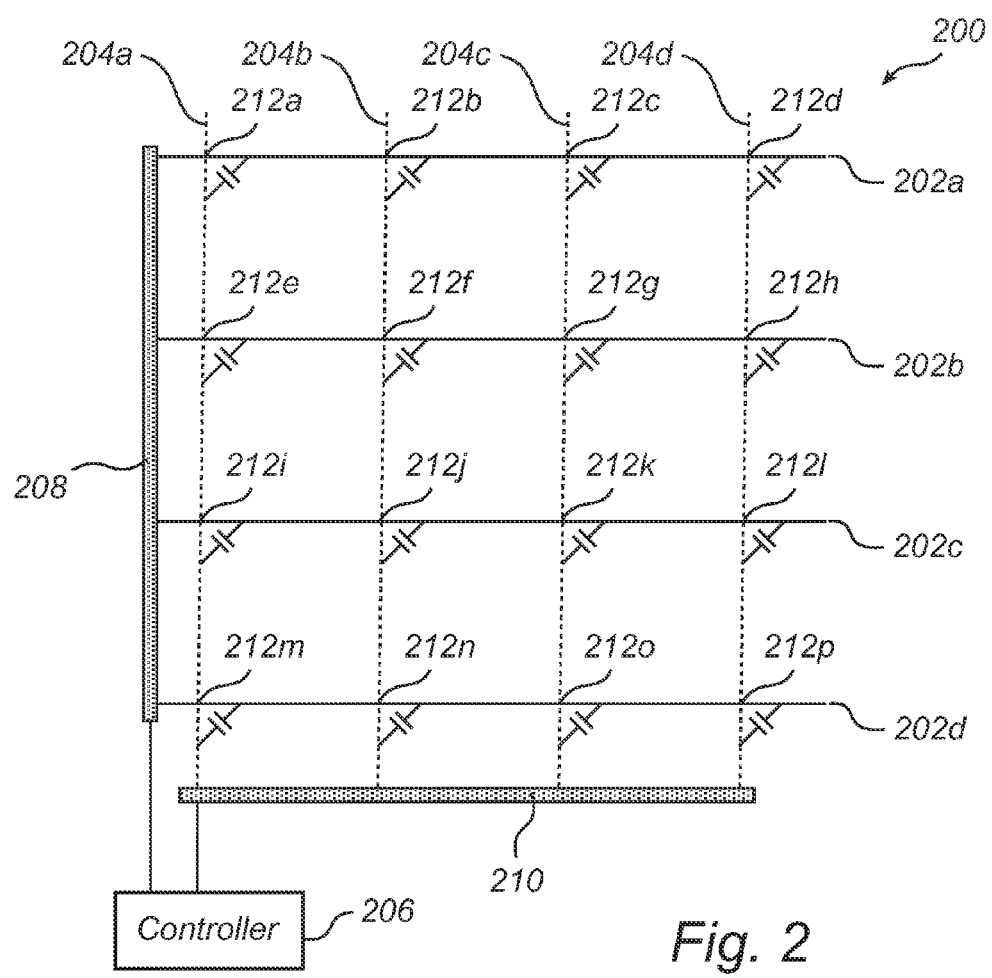
FIG. 2 is a schematic view illustrating a layout of a first plurality of conductors and a second plurality of conductors.

FIG. 2 is a schematic view illustrating a layout of a first plurality of conductors and a second plurality of conductors of an electronic textile 200. The first plurality of conductors 202a-d and the second plurality of conductors 204a-d are electrically insulated from each other and may, for example, be implemented as a set of conductive warp and weft yarn as previously described in relation to FIG. 1.

In FIG. 2, a first plurality of conductors 202a-d and a second plurality of conductors 204a-d of a portion of an electronic textile 200 are schematically shown, where the upper layer conductors are illustrated by solid lines in rows 202a-d, and the lower layer conductors are illustrated by dotted lines in columns 204a-d.

Furthermore, the electronic textile 200 is here connected to a controller 206 including a microcontroller which is connected to and adapted to control a row driver 208 driving rows 202a-d and a column driver 210 driving columns 204a-d. Here each driver includes a power supply. In some applications, the controller and drivers may advantageously be arranged on (or integrated in) the electronic textile. An example would be as the invention is used to detect faults in operation, e.g. in an electronic textile used for a textile display for advertising. However, it may often be advantageous to provide an external testing device which can be used to determine the functional area. The testing device typically includes the controller 206 and drivers 208, 210, as well as connectors for connecting the drivers 208, 210 to the conductors 202a-d, 204a-d. Thus, the drivers may be connected after the electronic textile has been cut to a desired shape. This allows all sides of the electronic textile to be cut.

As is recognized by a person skilled the art, the controller described in relation to FIG. 2, is only a schematic example of a way to control the row and column lines in the electronic textiles, and a variety of modifications can be made thereto without departing from the scope of the invention. For example, instead of a microcontroller, a microprocessor or an ASIC can be used.

A method for determining a functional area of the electronic textile will now be described with reference to the schematic flow-chart in FIG. 3, and to the schematic illustration of the electronic textile in FIG. 2.

The functional area of the electronic textile 200 can be determined by iteratively determining whether the capacitor 212a-212p associated with each crossover is part of the functional area by the following steps.

First, in step 301, an alternating voltage is applied between the row line and the column line associated with the capacitor, while the other row and column lines are held at ground, i.e. 0 V. For example, to evaluate the capacitor 212a an alternating voltage is applied between row line 202a and column line 204a.

In step 302, the controller detects an electrical characteristic indicative of a capacitance, here an alternating current. The size of the current associated with a capacitor depends on the frequency and the voltage being used, but is typically in the order of magnitude of µA.

In step 303, the detected alternating current is evaluated, for example, by comparing it to a predetermined threshold value. The threshold value is below the current expected for the capacitor, but sufficiently high to disregard noise.

Finally, in step 304, the controller determines whether the capacitor is included in the functional area of the electronic textile based on the evaluation in step 303.

If the evaluated row and column lines are functional up to the crossover, the capacitor at the crossover will pass current, resulting in an alternating current above the predetermined threshold value and the crossover is considered to be included in the functional area. However, if there is a cut in the row or column line before the crossover, essentially no current will be detected, and the crossover is considered not to be included in the functional area.

The procedure is repeated for each crossover in order to map out the functional area of the electronic textile.

It is recognized by a person skilled in the art that other electrical characteristics may be utilized to determine whether the capacitor is functional. For example, the capacitor may work as a filter. Thus, by applying an AC-signal and measuring the output, the capacitor can be detected. Another alternative would be to measure the voltage response from an AC-signal. Yet another alternative would be to apply a constant voltage, and then measure the discharge.

Although the method above is described with reference to capacitors which are formed between crossing conductors, it is recognized that the method is equally applicable to other arrangements. For example, to detect capacitors that are formed by parallel conductors separated by a dielectric.

Figure 4A:
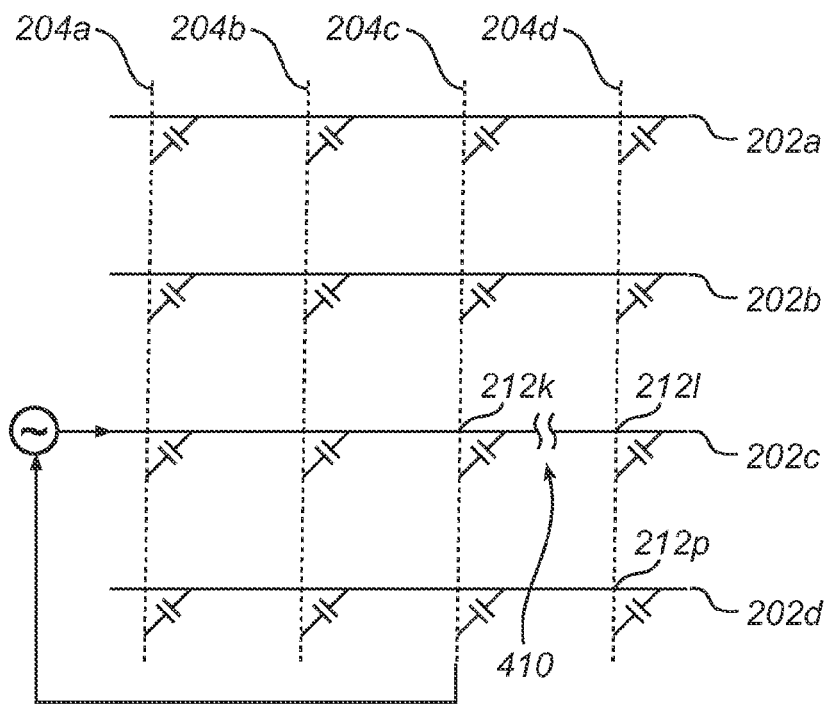
FIG. 4a-b is a schematic illustration of detection of a broken conductor.
Figure 4B:
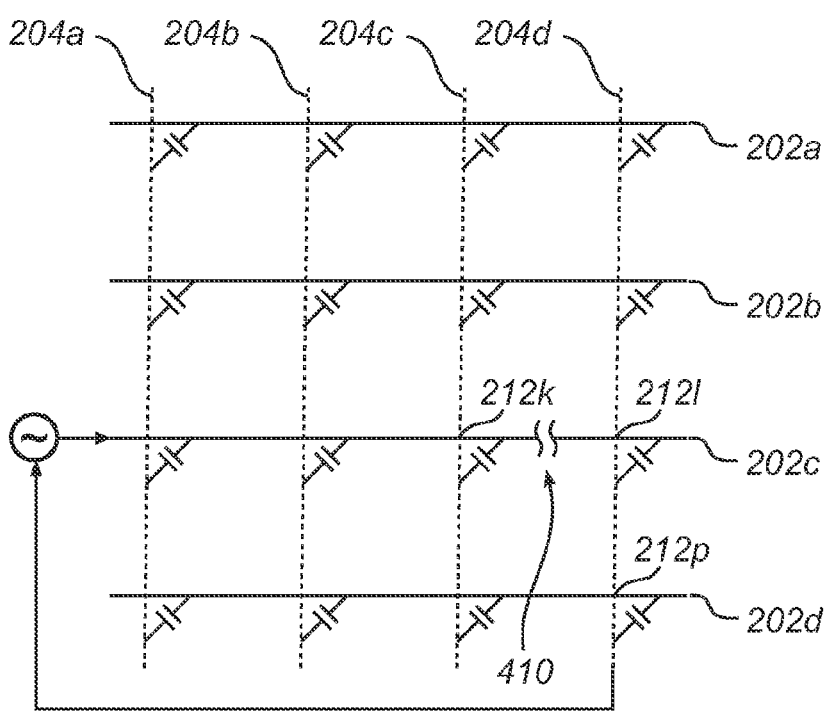

The above described method can be used to detect defects in the electronic textile, such as a conductor being cut off. An example thereof is schematically illustrated in FIG. 4a-b, where row line 202c is broken which is indicated with cut 410. As the functional area is determined an alternating current indicative of a capacitance can be detected for capacitor 212k before the break (illustrated by FIG. 4a), while essentially no current can be detected for capacitor 212l after the break (illustrated by FIG. 4b).

Figure 5A:
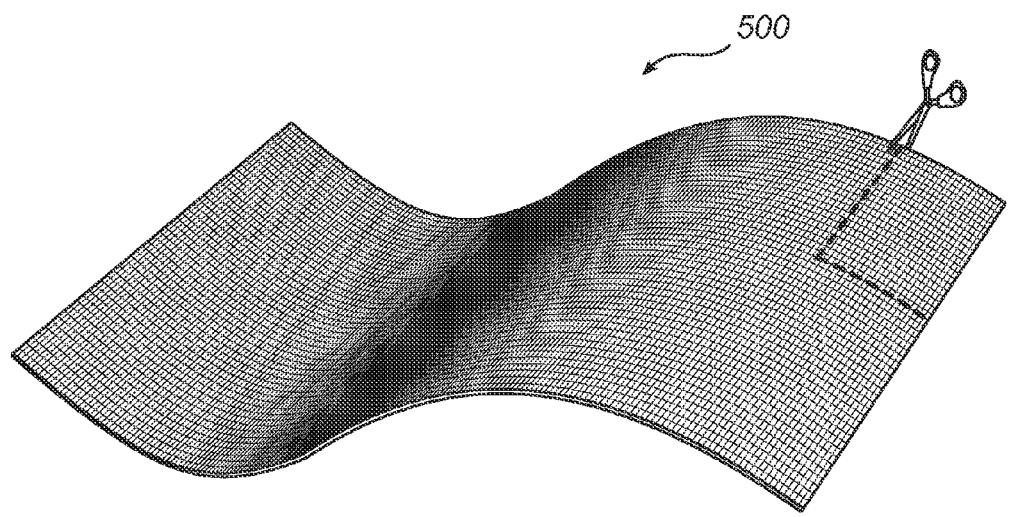
FIG. 5a schematically illustrates an electronic textile before it has been cut to a desired shape.

FIG. 5a schematically illustrates an embodiment of an electronic textile 500 before it has been cut in a desired shape, where the electronic textile is shown as a large, flexible sheet. This sheet may, for example, be a woven fabric in which the conductors are conductive yarns interwoven in the fabric as described above in relation to FIG. 1.

Figure 5B:
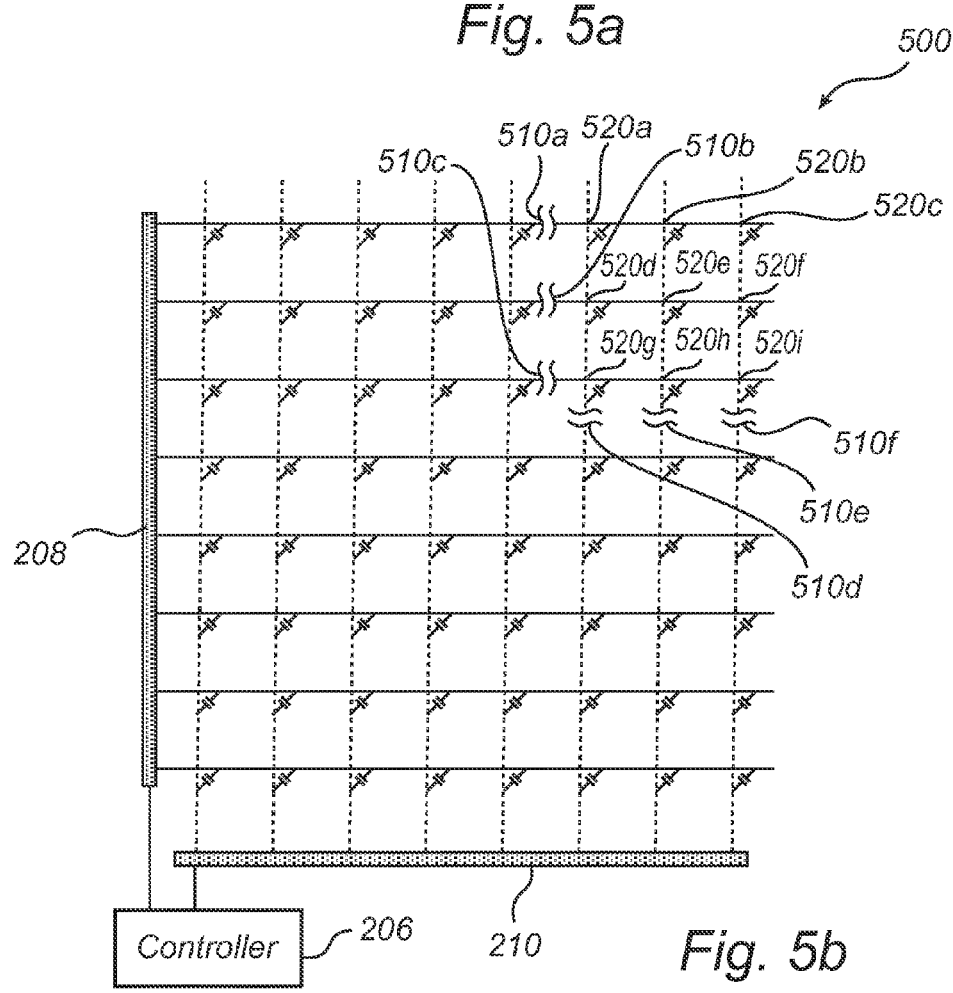
FIG. 5b schematically illustrates a portion of an electronic textile, where the upper right corner has been cut out.

FIG. 5b, schematically illustrates a portion of the electronic textile, where the functional area is determined according to the method described above in relation to FIG. 3. In the illustrated example, the upper right corner of the electronic textile has been cut out by cuts 510a-f. Thus, as the functional area is determined according to the procedure in FIG. 3, crossovers 520a-i in the upper right corner of the electronic textile 500 will be considered not to be included in the functional area, whereas the remaining crossovers will be considered part of the functional area.

According to an embodiment the electronic textile may include electronic devices such as, for example, lighting devices (such as e.g. LEDs), sensors, communication devices, etc, connected to the textile.

Figure 6A:
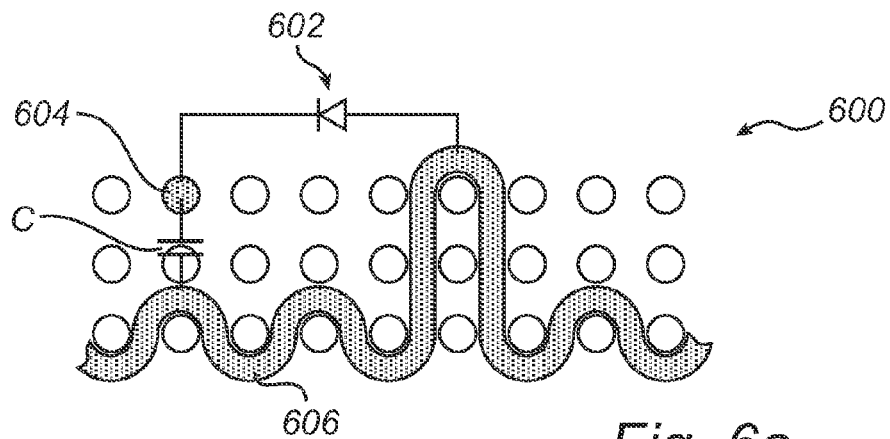
FIG. 6a-e are schematic cross-sections each showing an embodiment of an electronic textile according to the invention.

FIG. 6a shows a schematic cross-section of a portion of an electronic textile 600. The electronic textile 600 comprises an LED 602, powered via a set of driving conductors, here being a conductive warp yarn 604 and a conductive weft yarn 606. In addition to driving the LED 602, the conductive warp 604 and weft 606 yarn may also be used to determine the functional area of the electronic textile by measuring the capacitance C at the insulated crossover between the conductive warp yarn 604 and the conductive weft yarn 606 in accordance with the procedure described in relation to FIG. 3. As the voltage here is applied across the LED 602, the detected capacitance will be the serial capacitance of the capacitance of the LED $C_{LED}$ and the capacitance C of the insulated crossover. That is, the detected capacitance is $(C_{LED} \cdot C)/C_{LED}+C)$. Thus, this arrangement assumes that the capacitance of the LED $C_{LED}$ is sufficiently large for the detected capacitance not to fall below the threshold value used to determine the functional area.

Figure 6B:
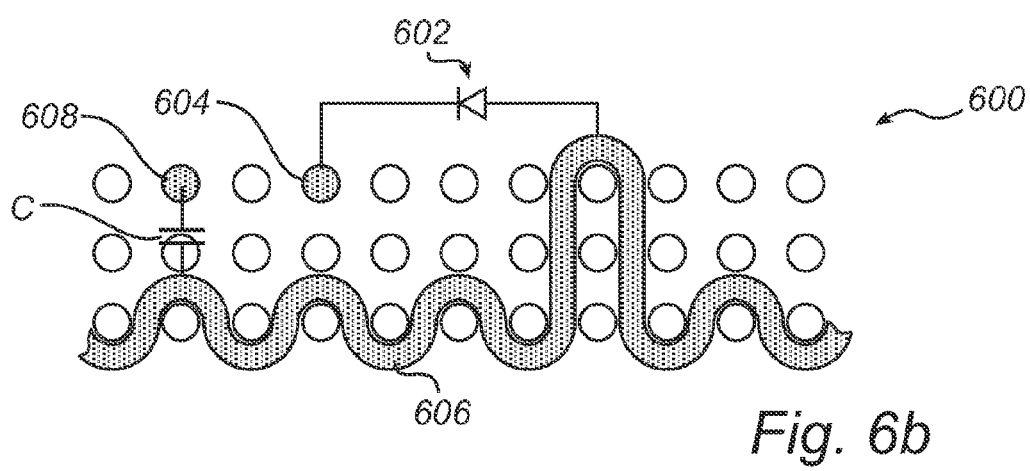

FIG. 6b shows a schematic cross-section of a portion of an electronic textile 600, where a set of driving conductors, here being conductive warp yarn 604 and conductive weft yarn 606, can be used to power the LED 602. Furthermore, an additional conductive warp yarn 608 is arranged to determine whether this portion of the electronic textile is part of the functional area by measuring the capacitance C at the insulated crossover between conductive yarn 606 and 608 in accordance with the procedure described in relation to FIG. 3. An advantage with using an additional conductor, such as conductive warp yarn 608, is that the alternating voltage used to determine the functional area is not applied across the electronic device 602 thereby reducing the risk that the electronic device is damaged. This may be particularly useful for electronic textiles comprising sensitive electronics.

Figure 6C:
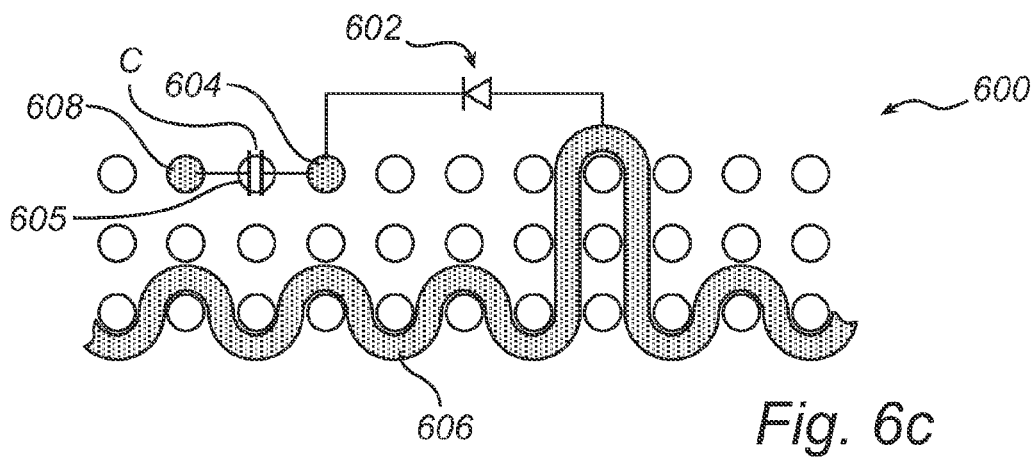

As schematically illustrated in FIG. 6c, it may also be possible to measure a capacitance C for a capacitor formed by two parallel conductors separated by a dielectric. Here the capacitor is formed by conductive warp yarn 604 and conductive warp yarn 608, which are separated by non-conductive warp yarn 605.

Figure 6D:
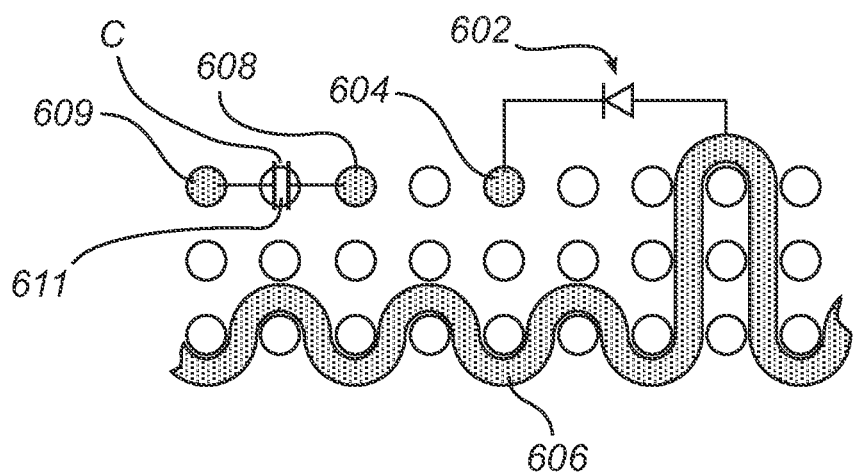

FIG. 6d schematically illustrates yet another embodiment where a capacitor is formed between two parallel conductors separated by a dielectric. Here the capacitor is formed by conductive warp yarn 608 and conductive warp yarn 609, which are separated by non-conductive warp yarn 611. It is noted that in this embodiment neither of the conductors 608, 609 associated with the capacitor C are used for driving electronic devices (such as the LED 602).

Figure 6E:
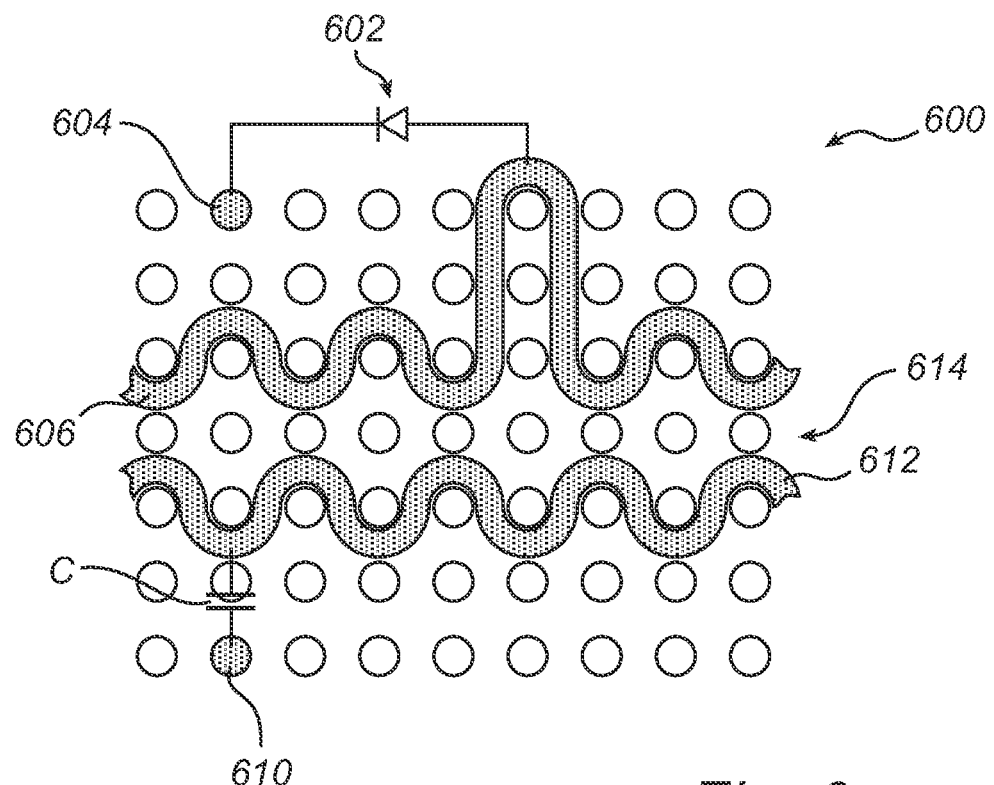

FIG. 6e schematically illustrates another embodiment, where a set of driving conductors, here being conductive warp yarn 604 and conductive weft yarn 606 are used for driving the LED 602. Moreover, a conductive warp yarn 610 and a conductive weft yarn 612 are arranged to determine whether this portion of the electronic textile is part of the functional area by measuring the capacitance C at the crossover between the conductive warp yarn 610 and the conductive weft yarn 612 in accordance with the procedure described in relation to FIG. 3. The driving conductors 604, 606 are here separated from the other conductors 610, 612 by a layer of non-conductive warp yarns 614.

Figure 7:
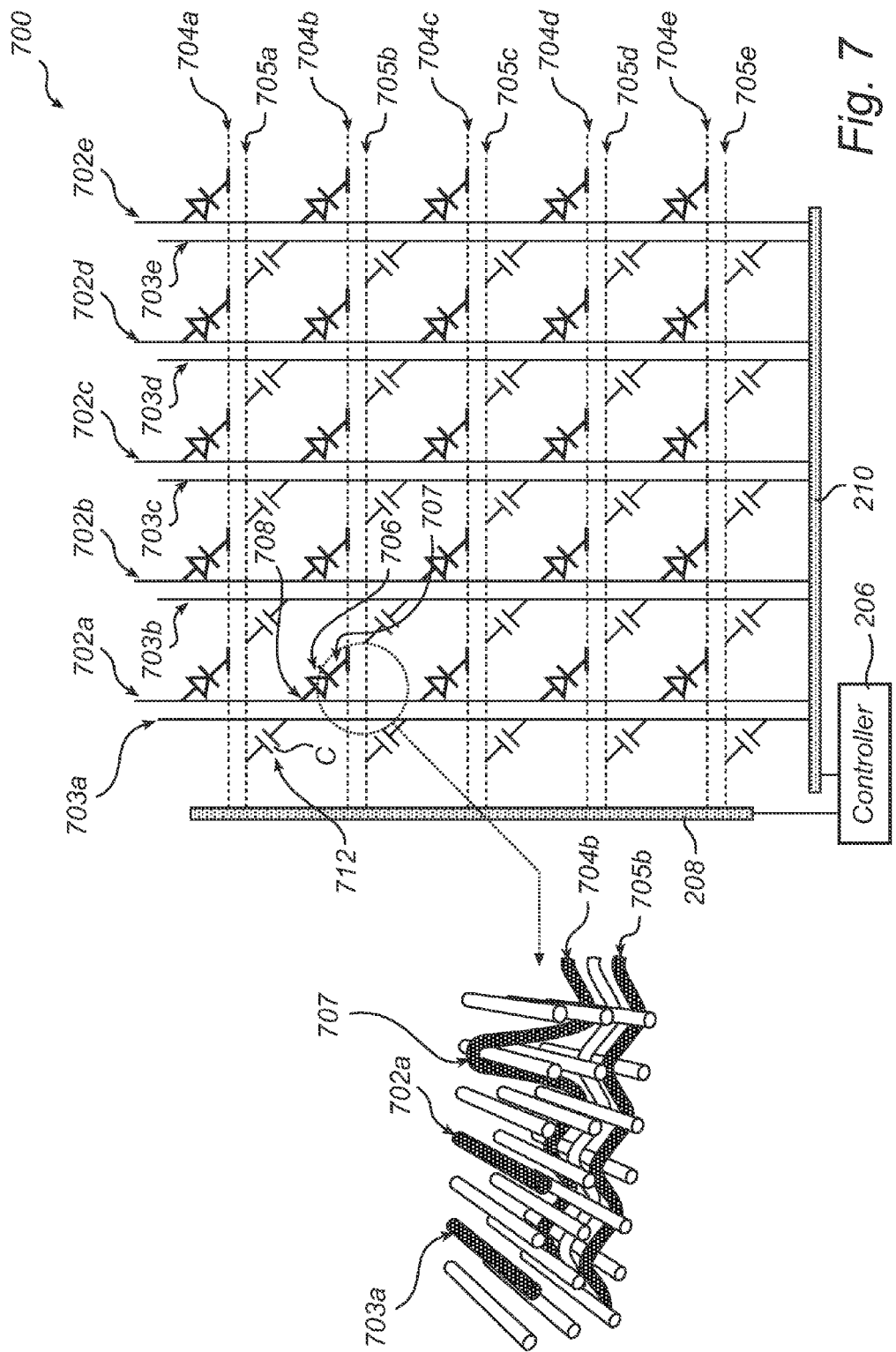
FIG. 7 schematically illustrates yet another embodiment of an electronic textile according to the invention.

FIG. 7 schematically illustrates the conductor layout for an electronic textile having three warp layers, where the conductors are interwoven conductive yarns in the warp and weft layer. The upper layer conductors are indicated by solid lines in columns, and the lower layer conductors are indicated by the dotted lines in rows.

Column lines 702a-e indicates a set of upper layer driving conductors and row lines 704a-e illustrates a set of lower layer driving conductors.

From each of the lower layer driving conductors 704a-e, loops are formed in the conductive weft, resulting in an indicated connection point 707 (only one of the connection points are indicated by reference numerals to avoid cluttering the figure). Between each of these connection points 707 and corresponding connection points 708 (once again, only one of these are indicated by reference numerals) of the upper layer driving conductors 702a-e, an LED 706 (only one of these are indicated by a reference numeral) is connected.

Furthermore, column lines 703a-e indicates a plurality of upper layer conductors useable for determining the functional area and row lines 705a-e indicates a plurality of lower conductors useable for determining the functional area (note that these are not used to power the LEDs 706). Each of the conductors 703a-e, 705a-e useable for determining the functional area extends next to one of the driving conductors 702a-e,704a-e, but is separated therefrom by one or more non-conductive yarns.

As illustrated in FIG. 7, a detectable capacitor 711 (only one of these are indicated by a reference numeral) is formed at each crossover between a conductor from the plurality of upper conductors 703a-e useable for determining the functional area and a conductor from the plurality of lower conductors 705a-e useable for determining the functional area.

Figure 3:
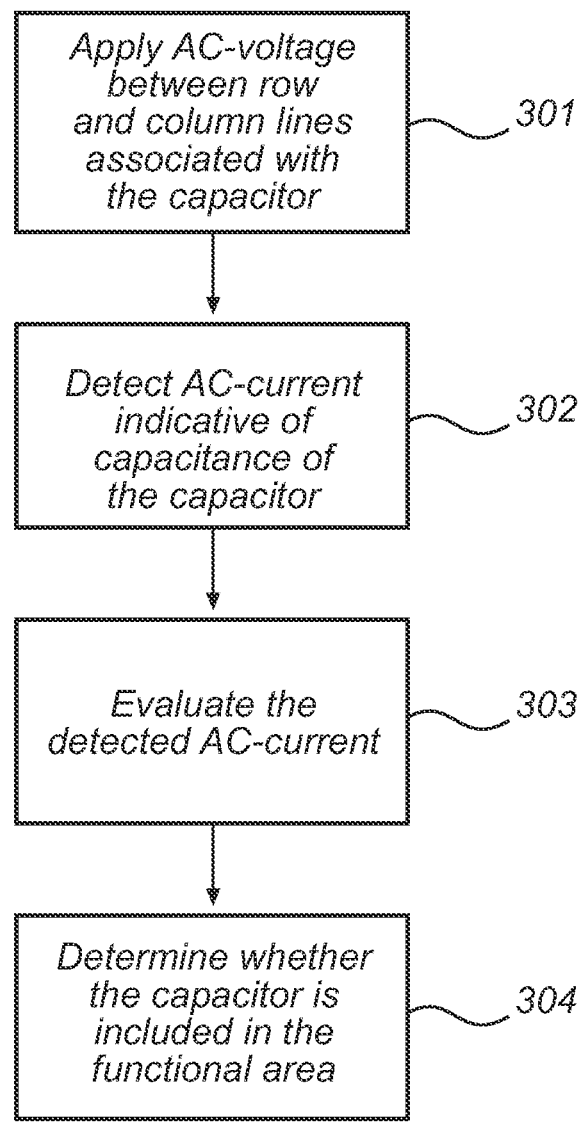
FIG. 3 is a schematic flow-chart of a method according to the invention.

Through the arrangement, the functional area can be determined by measuring the capacitance C of the capacitor 712 at each crossover according to the method described in relation to FIG. 3. An advantage with using conductors other than the driving conductors for determining the functional area is that it does not affect sensitive electronics as no voltage is applied across the electronic device. Additional conductors may also be added to locate a cut-off more accurately. After determining the functional area of the electronic textile, the conductors which are not used for driving electronic devices in the electronic textile can be used for ESD protection e.g. by connecting the conductors to ground. They may also be used for heat sinking.

According to an embodiment the electronic textile may be used in a textile display device. By determining the functional area of the electronic textile, the controller can adapt the image to the size and shape of the functional area using signal processing algorithms. In this way, a display textile can be cut to different shapes or experience reliability failures, and have an image created that fits to the active region. That is, the display controller is enabled to adapt the image data to the still addressable pixels. For example, in an advertising application where the textile display device is used to display a logo. A large textile can display a large logo, whereas a small textile automatically can scale the logo.

While the invention has been illustrated and described in detail in the drawings and foregoing description, such illustration and description are to be considered illustrative or exemplary and not restrictive; the invention is not limited to the disclosed embodiments. Variations to the disclosed embodiments can be understood and effected by those skilled in the art in practicing the claimed invention, from a study of the drawings, the disclosure, and the appended claims. In the claims, the word "comprising" does not exclude other elements, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A method for determining a functional area of an electronic textile comprising a textile substrate having a warp comprising a first plurality of conductors and a weft comprising a second plurality of conductors, wherein the textile substrate is configured such that a plurality of capacitors, each comprising a conductor from the first plurality of conductors and a conductor from the second plurality of conductors separated by a dielectric, are formed across substantially an entire surface of the electronic textile, the method comprising, for each of the capacitors, the steps of:

applying a voltage between the conductor from the first plurality of conductors associated with the capacitor and the conductor from the second plurality of conductors associated with the capacitor;

detecting an electrical characteristic indicative of a capacitance of the capacitor;

evaluating the detected electrical characteristic; and determining whether the capacitor is included in the functional area of the electronic textile based on the evaluation.

2. A method for determining the functional area of an electronic textile according to claim 1, wherein the voltage applied between the conductors is an alternating voltage.

3. A method for determining the functional area of an electronic textile according to claim 1, wherein the detected electrical characteristic is an alternating current.

4. A method for determining the functional area of an electronic textile according to claim 1, wherein the step of evaluating the detected electrical characteristic includes comparing the detected electrical characteristic to a predetermined threshold value.

5. A method for determining the functional area of an electronic textile according to claim 1, wherein any conductor(s) not associated with the evaluated capacitor(s) is kept at a constant voltage while the voltage is applied between the conductors associated with the evaluated capacitor(s).

6. The method of claim 1, wherein evaluating the detected electrical characteristic and determining whether the capacitor is included in the functional area of the electronic textile based on the evaluation comprises comparing the detected electrical characteristic to a threshold and determining that the capacitor is included in the functional area of the electronic textile when the detected electrical characteristic exceeds the threshold, and determining that the capacitor is not included in the functional area of the electronic textile when the detected electrical characteristic is less than the threshold.

7. A device for testing an electronic textile comprising a textile substrate having a warp comprising a first plurality of conductors, a weft comprising a second plurality of conductors, and a plurality of capacitors, each capacitor being formed by a crossover of a conductor from the first plurality of conductors and a conductor from the second plurality of conductors, separated by a dielectric, the capacitors being distributed across substantially an entire surface of the electronic textile, the device comprising:
 a first driver configured to drive a row or column of conductors connected to the first plurality of conductors;
 a second driver configured to drive a row or column of conductors connected to the second plurality of conductors; and
 a controller connected to the first driver and second driver, the controller operating to cause the first and second driver, for each of the plurality of capacitors, to apply a test voltage between the conductor from the first plurality of conductors associated with the capacitor and the conductor from the second plurality of conductors associated with the capacitor, wherein the controller further operates to:
  detect an electrical characteristic indicative of a capacitance of the capacitor;
  evaluate the detected electrical characteristic; and
  make a determination whether the capacitor is included in a functional area of the electronic textile based on the evaluation, wherein the controller determines the functional area of the textile based on the determinations for each of the plurality of capacitors.

8. The device of claim 7, wherein the controller causes the first and second drivers to apply a constant voltage to all of the conductors other than the conductor from the first plurality of conductors associated with the capacitor and the conductor from the second plurality of conductors associated with the capacitor while the test voltage is applied between the conductor from the first plurality of conductors associated with the capacitor and the conductor from the second plurality of conductors associated with the capacitor.

9. The device of claim 7, wherein the controller causes the first and second drivers to apply a ground voltage to all of the conductors other than the conductor from the first plurality of conductors associated with the capacitor and the conductor from the second plurality of conductors associated with the capacitor while the test voltage is applied between the conductor from the first plurality of conductors associated with the capacitor and the conductor from the second plurality of conductors associated with the capacitor.

10. The device of claim 7, wherein the controller makes the determination whether the capacitor is included in the functional area of the electronic textile based on the evaluation by comparing the detected electrical characteristic to a threshold, determining that the capacitor is included in the functional area of the electronic textile when the detected electrical characteristic exceeds the threshold, and determining that the capacitor is not included in the functional area of the electronic textile when the detected electrical characteristic is less than the threshold.

11. The device of claim 7, wherein the test voltage is an alternating current (AC) voltage.

12. The device of claim 11, wherein the AC voltage has a frequency between 1 kHz and 500 kHz.

13. The device of claim 7, wherein the detected electrical characteristic is the capacitance of the capacitor.

14. The device of claim 7, wherein the capacitance of the capacitor is greater than 100 pF.

15. A device configured to test an electronic textile comprising a textile substrate having a warp comprising a first plurality of conductors, a weft comprising a second plurality of conductors, and a plurality of capacitors, each capacitor being formed by a crossover of a conductor from the first plurality of conductors and a conductor from the second plurality of conductors, separated by a dielectric, the device comprising:
 a first driver configured to drive a row or column of conductors connected to the first plurality of connectors;
 a second driver configured to drive a row or column of conductors connected to the second plurality of conductors; and
 a controller connected to the first driver and second driver, wherein the controller is configured to:
 (a) select one of the capacitors connected to a corresponding selected pair of the conductors, the selected pair including one conductor from the first plurality of conductors and one conductor from the second plurality of conductors,
 (b) cause the first and second driver to apply a test voltage between the selected pair of the conductors,
 (c) detect an electrical characteristic indicative of a capacitance of the selected capacitor,
 (d) evaluate the detected electrical characteristic, and
 (e) determine whether the selected capacitor is included in a functional area of the electronic textile based on the evaluation.

16. The device of claim 15, wherein the controller is further configured to repeat (a) through (e) for a sufficient number of the plurality of capacitors to determine the functional area of the electronic textile.

17. The device of claim 15, wherein the controller is configured to cause the first and second drivers to apply a constant voltage to all of the conductors other than the selected pair of the conductors while the test voltage is applied between the selected pair of the conductors.

18. The device of claim 15, wherein the controller is configured to cause the first and second drivers to apply a ground voltage to all of the conductors other than the selected pair of the conductors while the test voltage is applied between the selected pair of the conductors.

19. The device of claim 15, wherein the controller is configured to determine whether the capacitor is included in a functional area of the electronic textile based on the evaluation by comparing the detected electrical characteristic to a threshold, determining that the capacitor is included in the functional area of the electronic textile when the detected electrical characteristic exceeds the threshold, and determining that the capacitor is not included in the functional area of the electronic textile when the detected electrical characteristic is less than the threshold.

20. The device of claim 15, wherein the test voltage is an alternating current (AC) voltage.

* * * * *